United States Patent [19]

Soldner et al.

[11] Patent Number: 5,163,435
[45] Date of Patent: Nov. 17, 1992

[54] PIEZOCERAMIC LAMINA ACOUSTIC DELAY LINE SUITABLE FOR USE IN AN ULTRASONIC DIAGNOSTIC SYSTEM

[75] Inventors: Richard Soldner, Herzogenaurach; Karl Prestele, Erlangen, both of Fed. Rep. of Germany

[73] Assignee: Siemens Aktiengesellschaft, Berlin and Munich, Fed. Rep. of Germany

[21] Appl. No.: 400,703

[22] Filed: Aug. 30, 1989

[30] Foreign Application Priority Data

Sep. 14, 1988 [EP] European Pat. Off. ........ 88115023.9
Jun. 27, 1989 [EP] European Pat. Off. ........ 89111710.3

[51] Int. Cl.⁵ .......................... A61B 8/00; H03H 9/30
[52] U.S. Cl. .................. 128/661.01; 333/141; 333/149; 333/150; 310/333; 310/334; 310/313 R
[58] Field of Search .................. 333/150-154, 333/141, 149, 193-196; 310/313 R, 313 B, 313 C, 313 D, 311, 333, 334; 128/661.01

[56] References Cited

U.S. PATENT DOCUMENTS

| | | | |
|---|---|---|---|
| 3,699,482 | 10/1972 | Ash et al. | 333/150 |
| 3,710,465 | 1/1973 | Thomann | 310/313 R X |
| 3,825,860 | 7/1974 | Carr | 333/151 |
| 3,906,410 | 9/1975 | Williams | 310/313 A X |
| 3,945,099 | 3/1976 | Kansy | 333/150 X |
| 4,097,825 | 6/1978 | Gerard | 333/151 |
| 4,101,852 | 7/1978 | Epstein et al. | 333/142 |
| 4,116,229 | 9/1978 | Pering | 128/661.01 |
| 4,117,424 | 9/1978 | Coldren et al. | 333/153 X |
| 4,204,178 | 5/1980 | Mitchell | 333/147 X |
| 4,253,338 | 3/1981 | Iinuma et al. | 73/626 |
| 4,350,916 | 9/1982 | August et al. | 310/313 B |
| 4,491,811 | 1/1985 | Niitsuma et al. | 333/151 |
| 4,516,094 | 5/1985 | Lee | 333/194 |
| 4,602,228 | 7/1986 | Yamada | 310/313 D X |
| 4,604,594 | 8/1986 | Angerer et al. | 333/151 X |
| 4,684,841 | 8/1987 | Este et al. | 333/151 X |

FOREIGN PATENT DOCUMENTS 3027583 1/1981 Fed. Rep. of Germany .
83420 5/1983 Japan .................................. 333/195
1473661 5/1977 United Kingdom .

OTHER PUBLICATIONS

Toda et al.; "Lamb-Wave Device With Three Mode Operation"; *Electronics Letters;* Nov. 23, 1978; vol. 14, No. 24; pp. 747-748.
"Analysis of Broadband Lamb-Way Delay Lines", Visintini et al., IEEE 1986 Ultrasonicis Symposium Proceedings, pp. 315-319.
"Lamb-Wave Delay Lines with Interdigital Electrodes", Toda, J. Appl. Phys., vol. 44, No. 1, pp. 56-62 (1973).

*Primary Examiner*—Eugene R. LaRoche
*Assistant Examiner*—Benny T. Lee
*Attorney, Agent, or Firm*—Hill, Van Santen, Steadman & Simpson

[57] ABSTRACT

An acoustic delay line includes electrodes on a monolithic piezoceramic substrate, which serve as electroacoustic transducers for the delay line. The distance between said transducers defines the transit time, and thus the delay path. Each transducer may have electrodes on the same side of the substrate, in which case thickness of the substrate is less than or equal to one-half the wavelength of the highest frequency to be transmitted in the substrate, so as to prevent the formation of higher modes. Alternatively, each transducer may have congruent electrodes on opposite sides of the substrate, in which case the thickness of the substrate is less than or equal to the wavelength of the highest frequency to be transmitted. The substrate is polarized substantially parallel to the equipotential lines which arise in the substrate upon the application of a voltage to the electrodes. The acoustic wave which is generated by one of the transducers therefore traverses the delay path between said transducers as a plate shear wave. High-precision broadband and distortion-free delay lines can thus be realized for low frequencies, with small component dimensions despite long delay times.

36 Claims, 3 Drawing Sheets

PIEZOCERAMIC LAMINA ACOUSTIC DELAY LINE SUITABLE FOR USE IN AN ULTRASONIC DIAGNOSTIC SYSTEM

BACKGROUND OF THE INVENTION

1. Field of the Invention

The present invention is directed to an acoustic delay line for electrical signals of the type having two electrode structures applied on a monolithic piezoceramic substrate forming the electro-acoustic transducers for the delay line, at a distance relative to each other which defines the transit time, and thus the delay line, path.

2. Description of the Prior Art

A delay line having two electrodes on a piezoceramic substrate forming the electro-acoustic transducers of the delay line is described in "Analysis of Broadband Lamb-Wave Delay Lines," Visintini et al., IEEE Ultrasonics Symposium, 1986, pages 315–319. Symmetrical electrode structures are applied to opposite sides of a piezoceramic lamina. The piezoceramic lamina is polarized in the direction of its thickness, so that the transducers generate symmetrical Lamb waves of zero order. Given high signal bandwidths, the dispersive transmission behavior of the Lamb waves has a negative influence, i.e., the acoustic propagation speed of the Lamb waves is dependent on the frequency. Moreover, there are a plurality of Lamb modes having different propagation properties for each frequency range. The selective excitation of the fundamental mode therefore requires the electrode structures to be manufactured with very close tolerances.

SUMMARY OF THE INVENTION

It is an object of the present invention to provide an acoustic delay which delays electrical signals in the frequency range of one through about twenty MHz in distortion-free, broadband fashion with low transmission losses and with narrow transit time tolerances.

It is a further object of the present invention to provide such an acoustic delay line having small dimensions while retaining high delay times.

In a first embodiment of the invention, the above objects are achieved in a delay line wherein the electrode structures of the transducers are congruently applied on opposite sides of a substrate, with the thickness of the substrate being less than or equal to the wavelength of the highest frequency to be transmitted in the substrate. The substrate is polarized substantially parallel to the equipotential lines which arise in the substrate upon the application of a voltage to the electrode structure.

In a second embodiment, the above objects are achieved in a delay line wherein the electrode structures of the transducers are applied only to one side of the substrate, and the thickness of the substrate is less than or equal to one-half the wavelength of the highest frequency to be transmitted in the substrate. Again the substrate is polarized substantially parallel to the equipotential lines which arise in the substrate upon the application of a voltage to the electrode structure.

As a result of the specified polarization direction, in combination with the selected thickness of the substrate, only plate shear waves in the fundamental mode arise in the delay line.

In comparison to components such as delay lines which make use of surface waves, components such as the delay line disclosed herein making use of plate shear waves can be used at low frequencies of, for example, 1 through 20 MHz. Good electro-mechanical coupling of the piezoceramic enables a relatively large bandwidth, with low insertion attenuation.

Noise signals (triple transit) are suppressed better in the delay line disclosed herein than in delay lines of the type used to generate delays in Pal (phase alternation line) and Secam (sequential a mimoire) decoders, which operate using volume waves, and transducers attached to the end face of a substrate. The electrode structures of the delay line disclosed herein may be arranged interdigitally, which is more economic to manufacture in large numbers.

Compared to purely electrical delay lines, fewer distortions occur in acoustic delay lines. Moreover, longer delay times and significantly lower transit time tolerances can be achieved in acoustic delay lines with minimum outlay, for example, the tolerance in an acoustic delay line may be ±10 ns or 0.1%, given a rated running time of 20 microseconds.

In a preferred embodiment, a plurality of electrodes are arranged in succession on the substrate in the propagation direction of the acoustic waves. These electrodes permit a signal to be delayed with selectively different delay times.

In a further embodiment of the invention, the substrate is structured so as to have no physical limitations in a direction parallel to the wave front of the acoustic waves. As a result, noise signals due to reflections at the substrate edges are suppressed. Another measure for suppressing noise signals (triple transit) is used in a further embodiment of the invention, wherein the two transducers (electrode structures) are not aligned parallel to each other.

For attenuating noise reflections, a further embodiment of the invention includes an absorber on the substrate disposed outside of the area of the transducers and the transit time (delay) path. The absorber may be an acoustic damping layer, or may be an electrical resistance layer. The electrical resistance layer converts the energy of the electric field, which is always present together with the acoustic wave, into thermal energy.

To avoid capacitive coupling between the transducers, a ground electrode is disposed between the transducers in a further embodiment.

For exact transit time balancing, a depolarized zone is present in the transit time (delay) path in a further embodiment. The extent of this zone defines the transit time change or adjustment, because the speed of sound in the depolarized zone is typically 10 through 20% lower than the speed of sound in the polarized substrate.

DESCRIPTION OF THE PREFERRED EMBODIMENTS

Figure 1:
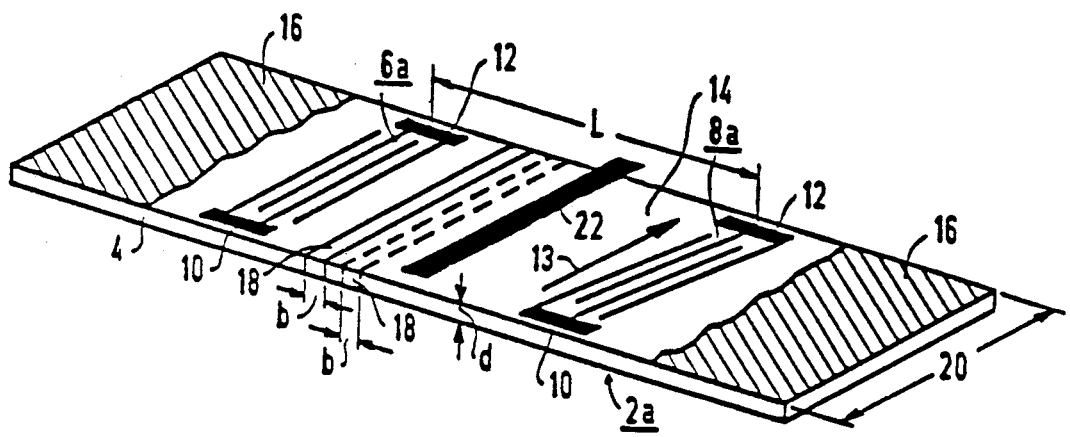
FIG. 1 is a perspective view of a single-sided embodiment of a delay line constructed in accordance with the principles of the present invention.

A first embodiment of a delay line constructed in accordance with the principles of the present invention is shown in FIG. 1, the delay line being generally referenced 2a. The delay line is constructed on a monolithic substrate 4, consisting of piezoceramic material such as for example, lead zirconate-titanate (PZT ceramic). Two electro-acoustic transducers 6a and 8a are arranged on the substrate 4 at a distance (center-to-center) L from each other. The transducers 6a and 8a are each formed, in combination, by interdigital electrode structures 10 and 12, and the volume of the piezoceramic substrate 4 disposed below the electrode structures. The electrode structures 10 and 12 are disposed on the same side of the substrate 4, and are preferably photolithographically generated. The details of the transducer structure depend upon the particular application of the delay line 2a. Dependent upon the bandwidth, insertion attenuation and noise suppression, the number of transducer fingers of the transducers 6a and 8a varies, and use can be made as well of aperture weighting, or "split fingers."

Figure 2:
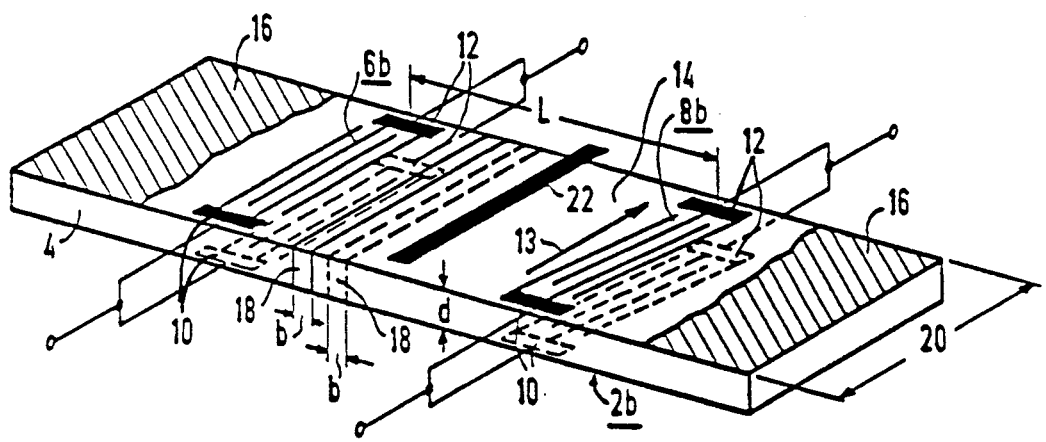
FIG. 2 is a perspective view of a double-sided embodiment of a delay line constructed in accordance with the principles of the present invention and including depolarized zones.

A further embodiment of a delay line 2b is shown in FIG. 2. In contrast to the delay line 2a of FIG. 1, the transducers 6b and 8b in the delay line 2b of FIG. 2 are formed by congruent, interdigital electrode structures 10 and 12 disposed on opposite sides of the substrate 4, in combination with the volume of the substrate 4 disposed between the electrodes. The electrodes 10 disposed opposite each other on the substrate 4 are electrically connected to each other, as are the electrodes 12 disposed opposite each other, so that the two electrodes in each congruent pair are at the same potential upon the application of a voltage.

In both of the embodiments of FIG. 1 and FIG. 2, the piezoceramic substrate 4 is polarized parallel to the fingers of the electrodes 10 and 12. This means that the substrate 4 is polarized substantially parallel to the equipotential lines which arise in the substrate 4 given the application of a voltage to the electrode structures of the transducers 6a or 8a (or 6b or 8b). As used herein, "substantially parallel" means that the components of the polarization which predominate are disposed in the direction of the equipotential lines. This is indicated in FIGS. 1 and 2 by the arrow 13. A horizontal plate shear wave arises in the substrate 4 (in both embodiments) due to this specific alignment of the polarization with respect to the electrical field generated by the electrodes 10 and 12. The thickness of the substrate 4 (i.e., the plate thickness d) is dimensioned so that only horizontally polarized shear waves of zero order can appear in the useful frequency range. To exclude higher modes, the relationship $d \leq c_s/2f_g$ must be satisfied for the thickness d of the piezoceramic substrate given the single-sided transducer structure of FIG. 1, and the relationship $d \leq c_s/f_g$ must be satisfied for the double-sided, congruent transducer embodiment of FIG. 2. In these relationships, $c_s$ denotes the shear wave speed of propagation, $f_g$ denotes the upper limit frequency of the shear wave. The thickness d of the piezoceramic substrate 4 is approximately 100 through 200 $\mu$m given an upper limit frequency $f_g$ of 10 MHz.

Laminae of the type used as the substrate 4 are extremely brittle. To improve manipulation, the substrate 4 may be glued to a stable carrier (not shown in the drawings) with a sufficiently elastic adhesive without deteriorating the function of the delay line.

The advantage of the plate shear wave of zero order is that it exhibits no dispersion, i.e., its speed of propagation is independent of the frequency. A broadband distortion-free delay of an electrical signal is thus obtained.

The transducer 6a (or 6b), for example, generates an acoustic shear wave in the substrate 4 after the application of an electrical signal to its electrodes 10 and 12. The acoustic wave then travels across the distance L in the substrate 4 from the transducer 6a (or 6b) to the transducer 8a (or 8b). This region of the substrate 4 forms a transit time or delay path 14. The wave which is simultaneously emitted by the transducer 6a (or 6b) in the opposite direction is absorbed by an absorber or acoustic sink 16. The transducer 8a (or 8b) converts the incoming acoustic wave back into an electrical signal, which is delayed by a time t relative to the signal emitted by the transducer 6a (or 6b). The time t corresponds to the transit time of the acoustic wave over the distance L.

A further absorber or sink 16 is disposed behind the transducer 8a (or 8b) in the direction of wave propagation, which damps the continuing acoustic wave. Reflection at the edges of the substrate 4 (edge echoes) are suppressed by the two sinks 16. The allocation of the transducer 6a (or 6b) as the transmission transducer and of the transducer 8a (or 8b) as the reception transducer is arbitrary, and has been selected only for describing an exemplary operation. The allocation of the transmission and reception transducers may be reversed.

The absorber or sink 16 may consist of a layer of electrically conductive resistor material, whose surface resistance is matched so that an optimum attenuation of the electrical field, which always appears together with an acoustic wave, is achieved.

In addition, or as an alternative, to the sinks 16, damping can be undertaken with an acoustic absorber. Suitable mechanical damping compounds as are known in the art are applied to the substrate 4 in a casting process, or by silk screening.

Because the propagation speed of acoustic waves in piezoceramic material is significantly lower than the propagation speed of electromagnetic waves, a correspondingly long delay of an electrical signal, with small component dimensions, is achieved by the distance L between the two transducers 6a and 8a (or 6b and 8b). The velocity of shear waves is only about one-half the Lamb wave velocity. Even for long delay times, therefore, the component dimensions are small. A delay line having a delay time of, for example, 20 $\mu$m has a length of about 50 mm.

A column-shaped depolarization zone 18 is created in the delay path 14 parallel to the wave propagation front. The zone 18 extends across the entire width 20 of the substrate 4 and has an extent b.

The zone 18 serves to exactly balance the transit time t. Because the transit time t can be only lengthened by the depolarized zone 18, the physical dimension L must be selected to be a distance which results in the lowest delay time which is expected to be required. The exact setting of the required delay time t can then be set by one or more depolarized zones 18, as indicated with dashed lines in FIG. 1 and FIG. 2. High-precision delay lines having a tolerance of, for example, 0.1% can be achieved by means of such balancing.

Figure 3:
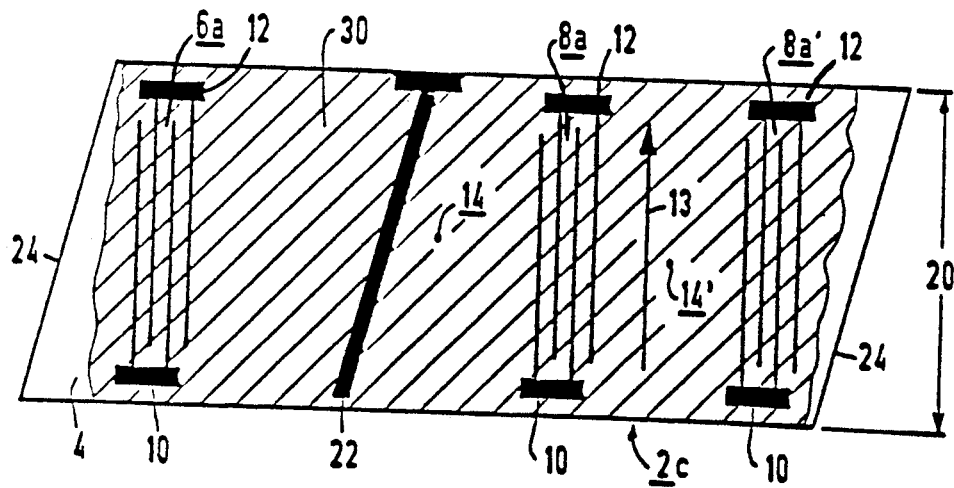
FIG. 3 is a plan view showing three transducers with a ground electrode in a delay line constructed in accordance with the principles of the present invention.

A delay line 2c having a one-sided transducer structure wherein the signals can be tapped with different delay times is shown in FIG. 3. Components identical to those already described in connection with FIGS. 1 and 2 have the same references signals in FIG. 3. In the embodiment of FIG. 3, a further transducer 8a' is disposed following the transducer 8a in the acoustic propagation direction. The total transit time or delay path between the transducer 6a and the transducer 8a' is comprised of a delay path portion 14 and a delay path portion 14'. It is possible to arrange further transducer 6a, 8a or 8a' on the substrate 4 in the direction of the acoustic propagation to permit a plurality of signals to be tapped with respectively different delays.

In the embodiment of FIG. 3, a ground electrode, 22 is disposed on the substrate 4 in the delay path 14 between the transducers 6a and 8a. The ground electrode 22 prevents capacitive coupling between the transducers 6a and 8a. The decoupling effect of the ground electrode 22 can be intensified by providing a conductive cage (not shown in the drawings) connected to the ground electrode 22 and arranged immediately proximate the transducers 6a, 8a and 8a' and to the delay paths 14 and 14'.

Unwanted reflections between the transducer 8 and the ground electrode 22 can be avoided by arranging the ground electrode 22 obliquely with respect to the acoustic propagation front and the transducer 8a. Reflections (multiple echoes) at the ground electrode 22 will therefore not be incident on the transducer 8a in equiphase, but will instead arrive with different phase relations, so that the resulting amplitude of the electrical noise signal is substantially zero, due to phase cancelling.

It is also possible to arrange the ground electrode 22 at a slight distance above the substrate 4 as shown in FIGS. 1 and 2, so that the wave propagation in the delay path 14 is not influenced. If this done, the ground electrode 22 can be, aligned with the transducer 8a without taking the alignment of the propagation wave front into consideration As can also be seen in FIG. 3, the substrate 4 has transverse edges 24 disposed at an angle other than 90° with respect to the longitudinal sides of the substrate 4. This angling of the transverse edges 24 also serves to suppress noise signals. The suppression occurs, again, because the acoustic waves reflected by the angled edges 24 are not incident on the transducer 6a, 8a and 8a' in the equiphase, but instead are incident with different phase relationships. Unwanted signals due to edge echoes are thus substantially avoided.

Another possibility for suppressing noise signals (triple transit) between the transmission transducer 6a and the reception transducer 8a (and between 6b and 8b) is to align the reception transducer 8a (or 8b) at an angle other than 90° relative to the acoustic propagation front. Such a slanted arrangement of the reception transducer 8a is shown in FIG. 1, and of the reception transducer 8b in FIG. 2. As a consequence, as in the previously discussed noise suppression embodiments, the reflected acoustic waves are not incident at the other electrodes in equiphase but instead cancel except for a small amplitude which is negligible.

Figure 4:
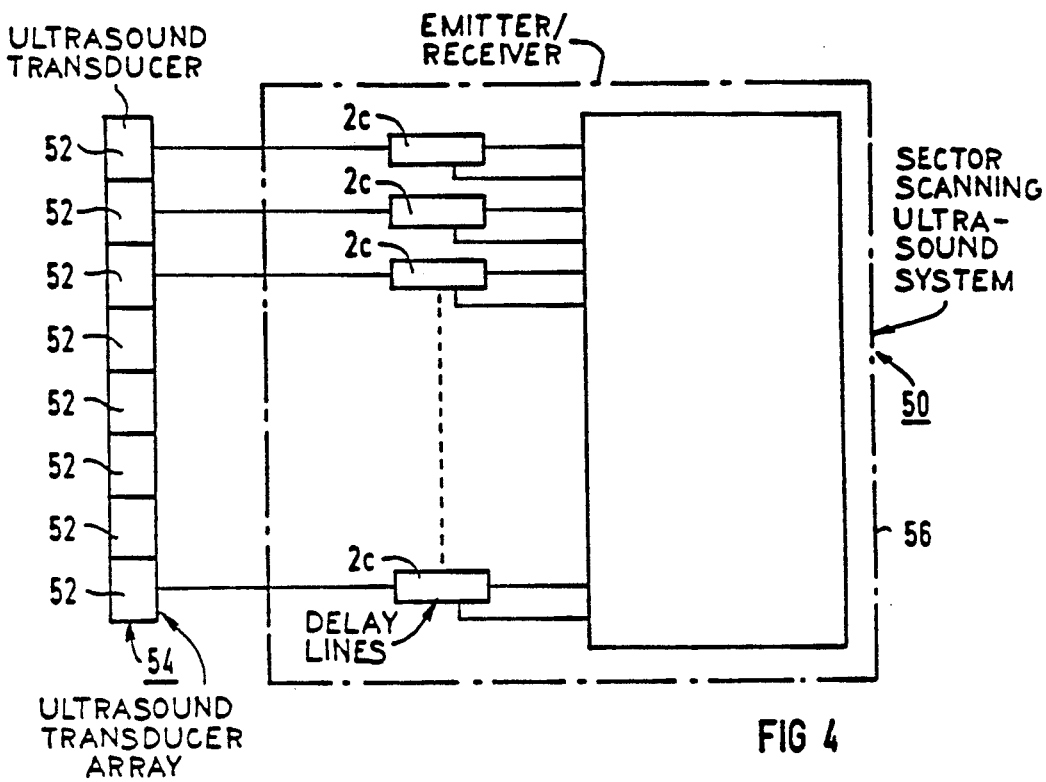
FIG. 4 is a schematic block diagram of a sector scanning ultrasound diagnostics system employing delay lines as shown in FIG. 3.
Figure 5:
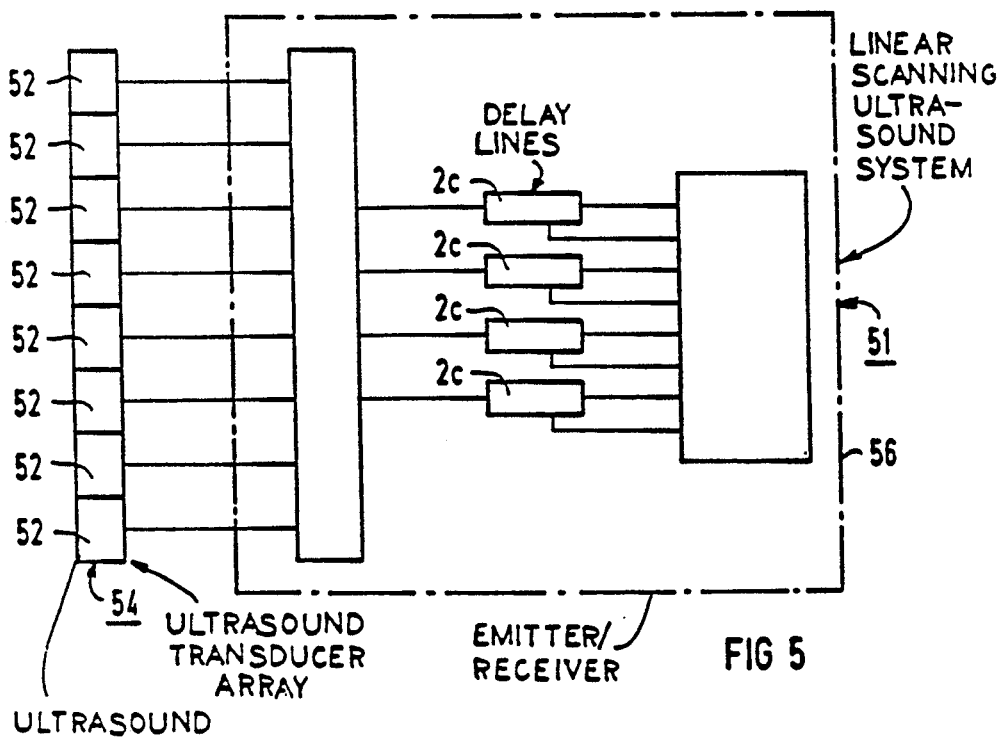
FIG. 5 is a schematic block diagram of a linear scanning ultrasound diagnostics system employing delay lines as shown in FIG. 3.

Acoustic delay lines in the frequency range of from 1 through 10 MHz having delay times up to 20 μs are used in ultrasound diagnostics systems 50 and 51, respectively shown in FIGS. 4 and 5, for examining body tissue. For this purpose, one delay line is respectively allocated to one (FIG. 4) or more (FIG. 5) individual ultrasound transducers 52 of a transducer array 54. The emitted ultrasound signals and the received echo signals are delayed in an emitter-receiver section 56, with the assistance of the delay lines 20, so that the ultrasound beam is focused to a defined depth (linear scanning, FIG. 5). Additionally, a sweep of the ultrasound beam can be undertaken so that a sector-shaped region is scanned (sector scanning, FIG. 4). If an ultrasound B-image/ is to be generated, the delay dependent attenuation of the piezoceramic substrate 4 can be selected so that no brightness discontinuities occur due to the inserted delay line. This can be accomplished by a suitable selection of material composition for the substrate 4, or by appropriate surface coating 30 of the delay path 14 (and 14'), to match the attenuation of the ultrasound beam in the body tissue, as shown in FIG. 3. Given identical transit times, the absorption of the acoustic wave in the delay path 14 (or 14') is thus identical to the absorption of the ultrasound signal in the body tissue.

Such ultrasound diagnostic systems using conventional delay lines are described, for example, in U.S. Pat. No. 4,253,338 (linear scanning) and U.S. Pat. No. 4,116,226 (sector scanning).

Although modifications and changes may be suggested by those skilled in the art, it is the intention of the inventors to embody within the patent warranted hereon all changes and modifications as reasonably and properly come within the scope of their contribution to the art.

We claim as our invention:
1. An acoustic delay line comprising:
a piezoceramic lamina capable of transmitting an acoustic shear wave and having an underside and opposite thereof a top side, and a thickness between said underside and said top side;
said thickness being equal to or less than a speed of propagation of said acoustic shear wave to be transmitted in the lamina, in a direction perpendicular to the thickness, divided by an upper limit frequency of a signal to be delayed in said piezoceramic lamina;
at least two electrode combinations on each of said underside and said top side disposed a distance from each other, each electrode combination having first and second electrode structures respectively and congruently disposed on said underside and said top side, said congruently disposed first electrode structures being electrically connected to each other and said congruently disposed second electrode structures being electrically connected to each other, said electrode combinations and a region of said lamina between said electrode combinations forming at least two electro-acoustic transducer means for converting said signal to be delayed, applied to the first and second electrode structures of one of said transducer means, into said acoustic shear wave for transmission in said piezoceramic lamina;
said distance defining a delay path for said acoustic shear wave between the at least two transducer means; and
said piezoceramic lamina being polarized perpendicularly to said thickness and to said distance and substantially parallel to equipotential lines which arise in said lamina upon an application of a voltage between said first and second electrode structures.

2. An acoustic delay line as claimed in claim 1, wherein said first and second electrode structures have an interdigital structure.

3. An acoustic delay line as claimed in claim 1, further comprising at least a third electro-acoustic transducer means disposed in said delay path on said lamina.

4. An acoustic delay line as claimed in claim 1, wherein said acoustic shear wave has a wave front which propogates in said lamina, and wherein said lamina is free of physical impediments to propagation parallel to said wave front.

5. An acoustic delay line as claimed in claim 1, wherein said transducer means are disposed on said lamina at a non-zero angle relative to each.

6. An acoustic delay line as claimed in claim 1, further comprising:
means applied on said lamina outside of said transducer means and outside of said delay path for attenuating noise reflections.

7. An acoustic delay line as claimed in claim 6, wherein said means for attenuating noise reflections is an acoustic damping layer.

8. An acoustic delay line as claimed in claim 6, wherein said shear wave has an electric field associated therewith, and wherein said means for attenuating noise reflections is an electrical resistance layer having an electrical conductivity matched to attenuate said electric filed.

9. An acoustic delay line as claimed in claim 1, further comprising:
a ground electrode disposed between said transducers.

10. An acoustic delay line as claimed in claim 9, wherein said ground electrode is disposed at a non-zero angle relative to one of said transducer means.

11. An acoustic delay line as claimed in claim 9, wherein said ground electrode is disposed directly on said lamina.

12. An acoustic delay line as claimed in claim 9, wherein said ground electrode is disposed a distance above said lamina.

13. An acoustic delay line as claimed in claim 1, further comprising:
a depolarized zone in said lamina disposed in said delay path.

14. In an ultrasound diagnostic system for examining body tissue, said ultrasound diagnostic system having an ultrasound array formed by a plurality of ultrasound transducers, said ultrasound transducer array directing ultrasound signals to said body tissue and receiving ultrasound echo signals, caused by reflection of the directed ultrasound signals, from said body tissue and each ultrasound transducer converting a first electrical signal into an ultrasound signal to be directed to said body tissue and converting a received ultrasound electrical signal into a second electrical signal, the improvement of an acoustic delay line for said first and second electrical signals comprising:
a piezoceramic lamina capable of transmitting an acoustic shear wave and having an underside and opposite thereof a top side, and a thickness between said underside and said top side;
said thickness being equal to or less than a speed of propagation of said acoustic shear wave to be transmitted in the lamina, in a direction perpendicular to the thickness, divided by an upper limit frequency of said first and second signals;
at least two electrode combinations on each of said underside and said top side disposed a distance from each other, each electrode combination having first and second electrode structures respectively and congruently disposed on said underside and said top side, said congruently disposed first electrode structures being electrically connected to each other and said congruently disposed second electrode structures being electrically connected to each other, said electrode combinations and a region of said lamina between said electrode combinations forming at least two electro-acoustic transducer means for respectively converting said first and second electrical signals into respective acoustic shear waves for transmission in said piezoceramic lamina, one of said transducer means being connected to at least one of said ultrasound transducers in said ultrasound transducer array for coupling a respective one of the first and second electrical signals associated with the ultrasound transducer;
said distance defining a delay path, with a delay, for said acoustic shear wave between the at least two transducer means; and
said piezoceramic lamina being polarized substantially perpendicularly to said thickness and to said distance and substantially parallel to equipotential lines which arise in said lamina upon an application of a voltage between said first and second electrode structures.

15. The improvement of claim 14 wherein said delay of said delay path has a duration for focusing said ultrasound signal.

16. The improvement of claim 14, wherein said body tissue has an absorption characteristic for said directed ultrasound signal, and wherein said lamina consists of a material composition having absorption properties of that absorption of said acoustic shear wave in said lamina in a transit time through said delay path is matched to said absorption characteristic of the directed ultrasound signal in said body tissue.

17. The improvement of claim 14 wherein said delay of said delay path has a duration for sweeping said ultrasound signal.

18. An acoustic delay line comprising:
a piezoceramic lamina capable of transmitting an acoustic shear wave and having an underside and opposite thereof a top side, and a thickness between said underside and said top side;
said thickness being equal to or less than one-half a speed of propagation of said acoustic shear wave to be transmitted in the lamina, in a direction perpendicular to the thickness, divided by an upper limit frequency of a signal to be delayed;
at least two electrode combinations on one of said underside or said top side disposed a distance from each other, each electrode combination having first and second electrode structures disposed said to one side, said electrode combinations and a region of said piezoceramic lamina below said first and second electrode structures forming at least two electro-acoustic transducer means for converting said signal to be delayed, applied to said first and second electrode structures, into said acoustic shear wave for transmission in said piezoceramic lamina;

said distance defining a delay path for said acoustic shear wave between at least two transducer means; and said piezoceramic lamina being polarized substantially perpendicularly to said thickness and to said distance and substantially parallel to equipotential lines which arise in said lamina upon an application of a voltage between said first and second electrode structures.

19. An acoustic delay line as claimed in claim 18, wherein said first and second electrode structures have an interdigital structure.

20. An acoustic delay line as claimed in claim 18, further comprising at least a third electro-acoustic transducer disposed in said delay path on said lamina.

21. An acoustic delay line as claimed in claim 18, wherein said acoustic shear wave has a wave front which propagates in said lamina, and wherein said lamina is free of physical impediments to propagation parallel to said wave front.

22. An acoustic delay line as claimed in claim 18, wherein said transducers are disposed on said lamina at a non-zero angle relative to each other.

23. An acoustic delay line as claimed in claim 18, further comprising:
means applied on said lamina outside of said transducers and outside of said delay path for attenuating noise reflections.

24. An acoustic delay line as claimed in claim 23, wherein said means for attenuating noise reflections is an acoustic damping layer.

25. An acoustic delay line as claimed in claim 23, wherein said shear wave has an electric field associated therewith, and wherein said means for attenuating noise reflections is an electrical resistance layer having an electrical conductivity matched to attenuate said electric field.

26. An acoustic delay line as claimed in claim 18, further comprising:
a ground electrode disposed between said transducers.

27. An acoustic delay line as claimed in claim 26, wherein said ground electrode is disposed at a non-zero angle relative to one of said transducer means.

28. An acoustic delay line as claimed in claim 26, wherein said ground electrode is disposed directly on said lamina.

29. An acoustic delay line as claimed in claim 26, wherein said ground electrode is disposed a distance above said lamina.

30. An acoustic delay line as claimed in claim 18, further comprising:
a depolarized zone in said lamina disposed in said delay path.

31. In an ultrasound diagnostic system for examining body tissue, said ultrasound diagnostic system having an ultrasound array formed by a plurality of ultrasound transducers, said ultrasound transducer array directing ultrasound signals to said body tissue and receiving ultrasound echo signals, caused by reflection of the directed ultrasound signals, from said body tissue and each ultrasound transducer converting a first electrical signal into an ultrasound signal to be directed to said body tissue and converting a received ultrasound signal into a second electrical signal, the improvement of an acoustic delay line for said first and second electrical signals comprising:

a piezoceramic lamina capable of transmitting an acoustic shear wave and having an underside and opposite thereof a top side, and a thickness between said underside and said top side;

said thickness being equal to or less than one-half a speed of propagation of said acoustic shear wave to be transmitted in the lamina, in a direction perpendicular to the thickness, divided by an upper limit frequency of said first and second signals;

at least two electrode combinations on one of said underside and or said top side disposed a distance from each other, each electrode combination having first and second electrode structures disposed said one side, said electrode combinations and a region of said piezoceramic lamina below said first and second electrode structures forming at least two electro-acoustic transducer means for respectively converting said first and second electrical signals into respective acoustic shear waves for transmission in said piezoceramic lamina, one of said transducer means being connected to at least one of said ultrasound transducers of said ultrasound transducer array for coupling a respective one of the first and second electrical signals associated with that ultrasound transducer;

said distance defining a delay path, having a delay, for said acoustic shear wave between the at least two transducer means; and said piezoceramic lamina being polarized substantially perpendicularly to said thickness and to said distance and substantially parallel to equipotential lines which arise in said lamina upon an application of a voltage between said first and second electrode structures.

32. The improvement of claim 31 wherein said delay of said delay path has a duration for focusing said ultrasound signal.

33. The improvement of claim 31, wherein said body tissue has an absorption characteristic for said directed ultrasound signal, and wherein said lamina consists of a material composition having absorption properties so that absorption of said acoustic shear wave in said lamina in a transit time through said delay path is matched to said absorption characteristic of the directed ultrasound signal in said body tissue.

34. The improvement of claim 31, wherein said body tissue has an absorption characteristic for said directed ultrasound signal, and said improvement further comprising a coating on said lamina covering said delay path so that absorption of said acoustic shear wave in said lamina and in said covering in a transit time through said delay path is matched to said absorption characteristic of the directed ultrasound signal in said body tissue.

35. The improvement of claim 31, wherein said delay of said delay path has a duration for sweeping said ultrasound signal.

36. The improvement of claim 14, wherein said body tissue has an absorption characteristic for said directed ultrasound signal, and said improvement further comprising a coating on said lamina covering said delay path so that absorption of said acoustic shear wave in said lamina and in said covering in a transit time through said delay path is matched to said absorption characteristic of the directed ultrasound signal in said body tissue.

* * * * *